(12) United States Patent
Schulter

(10) Patent No.: US 11,947,482 B2
(45) Date of Patent: Apr. 2, 2024

(54) DATA NETWORK HAVING AT LEAST THREE LINE BRANCHES, WHICH ARE CONNECTED TO ONE ANOTHER VIA COMMON STAR NODE AS WELL AS A MOTOR VEHICLE AND OPERATING METHOD FOR THE DATA NETWORK

(71) Applicant: Conti Temic microelectronic GmbH, Ingolstadt (DE)

(72) Inventor: Wolfgang Schulter, Meersburg (DE)

(73) Assignee: Conti Temic microelectronic GmbH, Ingolstadt (DE)

( * ) Notice: Subject to any disclaimer, the term of this patent is extended or adjusted under 35 U.S.C. 154(b) by 0 days.

(21) Appl. No.: 17/784,952

(22) PCT Filed: Nov. 30, 2020

(86) PCT No.: PCT/EP2020/083828
§ 371 (c)(1),
(2) Date: Jun. 13, 2022

(87) PCT Pub. No.: WO2021/121915
PCT Pub. Date: Jun. 24, 2021

(65) Prior Publication Data
US 2023/0048283 A1     Feb. 16, 2023

(30) Foreign Application Priority Data
Dec. 17, 2019   (DE) .................... 10 2019 219 904.6

(51) Int. Cl.
*G06F 13/40*     (2006.01)
*H03K 5/01*       (2006.01)
(Continued)

(52) U.S. Cl.
CPC ........... *G06F 13/4027* (2013.01); *H03K 5/01* (2013.01); *H04L 12/40045* (2013.01); *H03K 2005/00013* (2013.01)

(58) Field of Classification Search
CPC . G06F 13/4027; H04L 12/40046; H03K 5/01; H03K 2005/00013
See application file for complete search history.

(56) References Cited

U.S. PATENT DOCUMENTS

| 4,107,554 A | 8/1978 | Tao |
| 5,313,460 A | 5/1994 | Schmid |

(Continued)

FOREIGN PATENT DOCUMENTS

| CN | 102804545 A | 11/2012 |
| CN | 104882595 A | 9/2015 |

(Continued)

OTHER PUBLICATIONS

Correa et al. "Automotive Ethernet—The Definitive Guide", Intrepid Control Systems, 2014.

(Continued)

*Primary Examiner* — Henry Tsai
*Assistant Examiner* — Christopher A Daley

(57) ABSTRACT

A data network has at least three line branches connected via a common star node to distribute message signals from one of the line branches onto the other line branches, wherein connected to at least one of the line branches is at least one bus-user device is configured to generate in a corresponding transmit mode by a corresponding transmit unit at least one of the message signals, wherein in the corresponding bus-user device, the transmit unit has a current source circuit which, in generating the message signal (16), is configured to inject an electric current into electrical lines of the line branch to which the bus-user device is connected, and via (Continued)

the current source circuit the lines are connected to an internal impedance value of the current source circuit that in transmit mode is constantly greater than 10 times the value of the characteristic impedance, for example greater than 500 Ohms.

13 Claims, 7 Drawing Sheets

(51) Int. Cl.
*H04L 12/40* (2006.01)
*H03K 5/00* (2006.01)

(56) References Cited

U.S. PATENT DOCUMENTS

| | | | |
|---|---|---|---|
| 5,734,658 A | 3/1998 | Rall et al. | |
| 6,115,831 A | 9/2000 | Hanf et al. | |
| 8,838,763 B2 * | 9/2014 | Grohman | G05D 23/1917 333/32 |
| 9,652,423 B2 * | 5/2017 | Monroe | H04L 12/40032 |
| 11,133,957 B2 * | 9/2021 | Portillo | H04L 12/40 |
| 2009/0160479 A1 | 6/2009 | Lange et al. | |
| 2012/0091814 A1 | 4/2012 | Koshin et al. | |
| 2015/0243972 A1 | 8/2015 | Ito et al. | |

FOREIGN PATENT DOCUMENTS

| | | |
|---|---|---|
| DE | 3936894 A1 | 5/1991 |
| DE | 29802483 U1 | 4/1999 |
| DE | 102005009491 A1 | 8/2006 |
| DE | 102018216949 A1 | 4/2020 |
| EP | 0610276 B1 | 2/1997 |
| EP | 0798895 A1 | 10/1997 |
| EP | 2701274 A1 | 2/2014 |
| EP | 2701274 B1 | 7/2019 |
| JP | 2007201697 A | 8/2007 |

OTHER PUBLICATIONS

"Low Voltage Differential Signaling", Wikipedia.
Mietke "Leitungen und ihre Eigenschaften", https://www.elektroniktutor.de/elektrophysik/leitung.html, 2002-2022.
Zimmermann et al. "Bussysteme in der Fahrzeugtechnik—Protokolle, Standards und Softwarearchitektur", Kapitel 1+2, S. 1-55, Springer Vieweg, 2014.
Office Action dated Aug. 23, 2022 from corresponding German patent application No. 10 2019 219 904.6.
International Search Report and Written Opinion dated Feb. 18, 2021 from corresponding International patent application No. PCT/EP2020/083828.
Office Action dated May 17, 2023 from corresponding Chinese patent application No. 202080087681.3.
Office Action dated Dec. 19, 2023 from corresponding Chinese patent application No. 202080087681.3.

* cited by examiner

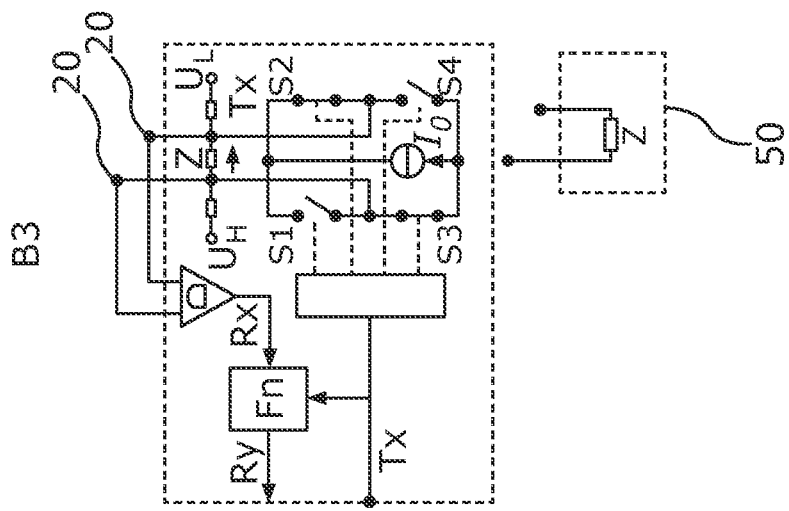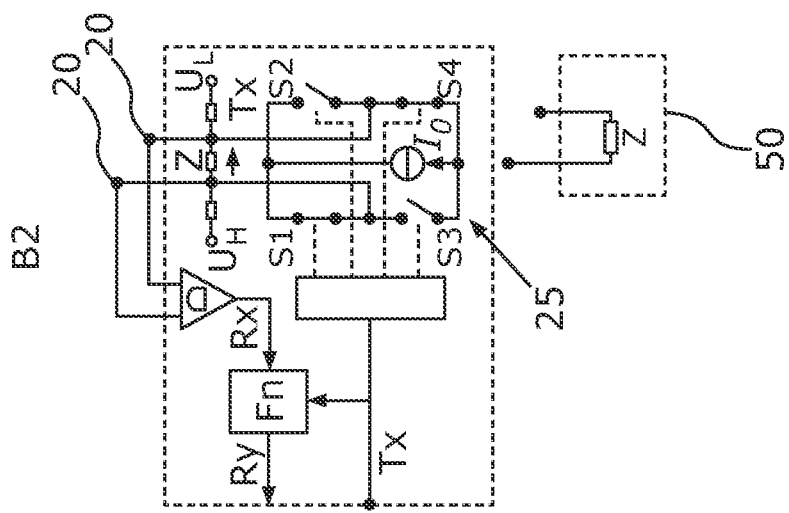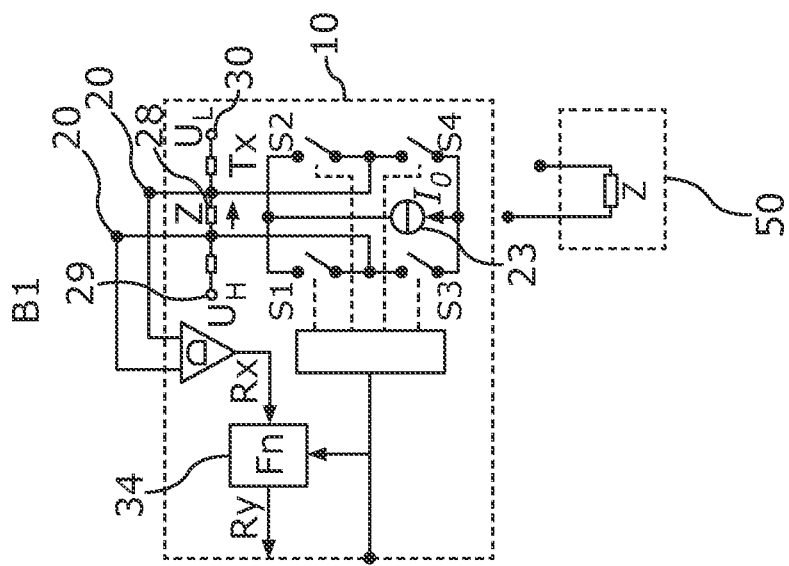
Fig.6

DATA NETWORK HAVING AT LEAST THREE LINE BRANCHES, WHICH ARE CONNECTED TO ONE ANOTHER VIA COMMON STAR NODE AS WELL AS A MOTOR VEHICLE AND OPERATING METHOD FOR THE DATA NETWORK

Data network having at least three line branches connected to one another via a common star node, and motor vehicle and operating method for said data network The invention relates to a data network having at least three line branches connected to one another via a common star node. If in a line branch, a bus-user device emits a message signal, this can be distributed into the other two or more line branches. The star node is passive, which means that in distributing the message signal, a reflection occurs at the star node, which is reflected back to the transmitting bus-user device. The invention relates to a motor vehicle having an embodiment of the data network according to the invention. Lastly, the invention also includes a method for operating a data network in order to distribute message signals into a plurality of line branches.

In a motor vehicle, a data bus such as a CAN (Controller Area Network) or a Flexray data bus or even an Ethernet can be provided, for instance, as the data network. These mostly use a linear structure for the electrical two-wire line, via which the message signals are exchanged in the data network between the bus-user devices. A termination impedance is connected to each end of the linear structure in order to suppress or attenuate a reflection of the propagating waves. A reflection can also occur at a star node, at which one line branch transitions into two other line branches. Currently this can only be permitted if one of the line branches constitutes a relatively short stub, which is connected as a high impedance to the main linear structure. If there is a wish to connect more than two line branches, so at least three line branches, to one another in a star node, then this can only be done by an active star node in the form of a "hub" or "switch", which can use a termination impedance to terminate individually the line branches that end in the star node, or can protect against reflection of an arriving message signal. This involves a relatively high circuit complexity, however, in order to interconnect at least three line branches in a star node.

Patent EP 0610276 B1 describes a data communications system based on the CAN bus in which a passive star node is implemented according to the invention. Without further measures, such a star node having relatively long line segments would result in unwanted reflections and hence in signal distortions on the lines and at the receivers and hence in information loss. Methods described in EP 0610276 B1 avoid this drawback by using slide-on ferrite cores to transform the impedances of the line segments, resulting in a sufficiently good low-reflection star structure within a limited frequency band.

This method is not viable for higher symbol rates, however. If higher baud rates are wanted, active star nodes are normally employed, so that lines terminated at both ends to the individual ECUs can be used with active relaying of messages, for instance based on the model of Ethernet switches.

Using a passive star node, for instance simply electrically connecting the electrical lines of at least three line branches in a star node, causes the described reflections in the star node, making interference-free operation impossible at high bit rates (greater than one Megabit per second).

The object of the invention is to provide a data network having at least three line branches that allows interference-free operation with low technical complexity.

The object is achieved by the subject matter of the independent patent claims. Advantageous embodiments of the invention are described by the dependent patent claims, the description that follows and the figures.

The invention provides a data network having at least three line branches connected to one another via a common star node. The star node is in particular an electrically passive star node, i.e. electrical lines of the line branches are connected galvanically to one another in the common star node. The line branches can be of equal or similar length, which means that each of the line branches can be of length greater than 50 centimeters. The line branches are connected to one another via the common star node in order to distribute message signals from one of the line branches onto the other line branches. In the data network can be connected to each line branch at least one bus-user device, which is configured to generate in a corresponding transmit mode by means of a corresponding transmit unit at least one of said message signals. It can also be provided, however, that a transmitting bus-user device is provided only in one or some of the line branches.

If such a bus-user device transmits a message signal into the line branch to which said bus-user device is connected, then the message signal propagates towards the star node and there is distributed onwards onto the other line branches or transferred into these line branches. There is, however, also a reflection of the message signal at the star node, which results in some of the energy of the message signal being reflected back into the line branch that contains the transmitting bus-user device. In a manner known per se, a termination impedance can be connected at the end of such a line branch so that this reflection is attenuated or suppressed there. Producing a further reflection (of the message signal already reflected at the star node) at the transmitting bus-user device must be prevented, however. To achieve this, in the corresponding bus-user device, the transmit unit thereof has a current source circuit which, for the purpose of generating the message signal, is configured to generate or to inject an electric current into the electrical lines of the circuit branch to which the bus-user device is connected. A current source circuit can be embodied, as is known per se from the prior art, for instance by LVDS, (see e.g. the web page https://en.wikipedia.org/wiki/Low-voltage differential signaling). In this case, a person skilled in the art seeking to implement the data network according to the invention must simply make sure that via the current source circuit, the lines are connected to an internal impedance of the current source circuit that in transmit mode is constantly greater than 10 times the value of the characteristic impedance of the line, in particular constantly greater than 500 Ohms. In other words, the transmit unit is connected by its current source circuit between the lines of the line branch constantly "as a high impedance" even in transmit mode. If now the message signal reflected at the star node arrives again at the transmit unit of the transmitting bus-user device, then, as a result of the described high-impedance connection of the transmit unit to the line branch, no further reflection, or only a negligible further reflection, is produced here by the current source circuit, because the high-impedance current source circuit connected in parallel with the termination impedance behaves electrically in a similar manner to a line segment of the line branch in which there is no bus-user device connected at all.

The invention provides the advantage that in the data network, despite a common star node via which at least three line branches are connected to one another, only a single, simple reflection of a message signal takes place back into the line branch to which the transmitting bus-user device is connected. No further reflection, which might be directed back again to the star node, takes place at the bus-user device. Since the transmitting bus-user device itself knows the transmitted message signal, in this bus-user device the interference in the voltage waveform in the line branch, which interference is caused by the reflection, is irrelevant. Thus more than two line branches can be interconnected in the data network via a common star node without a reflection of the transmitted message signal causing confusion or errors in reception for the receiving bus-user devices.

The invention also encompasses embodiments that afford additional advantages.

In the data network, a bus-user device can be connected either at a line end of one of the line branches or along a line branch between a line end and the star node. Different embodiments of the invention take into account the resultant different reflection properties required of the bus-user devices.

In one embodiment, in at least one bus-user device which is connected to a line end of one of the line branches, its transmit unit is configured such that it has a termination circuit connected in parallel with the current source circuit. The termination circuit connects the electrical lines of the line branch to which the bus-user device is connected, and also has an electrical impedance value equal to a line impedance of the line branch. Thus whereas the current source circuit is itself high impedance in the aforementioned sense, a message signal arriving at the bus-user device at the line end is attenuated or "swallowed" by the termination circuit, because the impedance value of this termination circuit is equal to the line impedance of the line branch. By virtue of using the current source circuit, it is possible to match the termination circuit to the line impedance of the line branch regardless of the other electrical properties of the current source circuit.

In one embodiment, in a bus-user device which is not connected at the line end of a line branch itself but between a line end of one of the line branches and the star node, this bus-user device has an open-circuit, which, in the event that the current source circuit is inactive, electrically isolates the lines of the line branch. Thus if the current source circuit is switched off, the electrical lines of the line branch are also electrically isolated from each other. When the current source circuit is in transmit mode, only the electrical impedance of the current source circuit itself thus appears between the lines of the line branch, which impedance is high enough, in the manner described, to avoid a signal reflection, or to produce a signal reflection having a negligible reflection coefficient (reflection coefficient of less than 20 percent, in particular less than 10 percent, which can be achieved by selecting the internal electrical impedance of the current source circuit to be sufficiently high, which can be facilitated by circuits from the prior art).

So far it has been described how a bus-user device can use a current source circuit to prevent, in the case of transmitting a message signal, the situation in which the reflection of said signal, which reflection occurs at the star node and arrives back at the transmitting bus-user device, is able to be reflected again towards the star node.

Embodiments are described below that relate to the receiving of message signals.

In one embodiment, each of the at least one bus-user devices has a receive circuit, which is configured to receive as a receive signal from the corresponding line branch to which the bus-user device is connected at least one message signal from another bus-user device. Thus the bus-user device can use the receive circuit to listen on the line branch, and receive and, for instance, amplify and/or transfer to a microcontroller, a receive signal arriving via the line branch. The receiver circuit comprises a compensation filter, which is configured such that when the associated transmit unit, i.e. the transmit unit of the associated bus-user device that also contains the receive circuit, is in transmit mode, it superimposes with a time offset the associated message signal emitted by the transmit unit negatively on the receive signal, i.e. it subtracts this message signal from the receive signal. In this process, this message signal is not superimposed at the original signal level but is weighted. The weighting here equals the reflection coefficient of the star node and optionally an attenuation value for the line segment between the bus-user device and the star node. The time offset for the negative superposition equals the signal travel time in the line branch from the bus-user device to the star node and back to the bus-user device. Thus if there is a reflection of the associated emitted message signal at the star node, the message-signal component reflected at the star node will arrive at the receive circuit at the same time at which the compensation filter also starts the negative and weighted superposition of the associated message signal. Since this is performed as a negative superposition, the arriving, reflected component of the emitted message signal is compensated or quenched by the compensation filter. In contrast, the compensation filter does not have a detrimental effect on an unknown, foreign message signal from another bus-user device. Hence this makes full-duplex operation possible in the data network.

In one embodiment, said compensation filter is implemented on the basis of at least one analog delay line and at least one amplifier circuit. It is thereby also possible to provide the signal travel time of a short line segment of a line branch, for instance less than three meters, in particular less than two meters, as the time offset or time delay. A digital compensation filter would be technically more complex for a short time offset of this kind. The delay line can be implemented on the basis of an electromagnetic delay, as can be achieved by a coiled wire and using a dielectric and/or a ferromagnetic material, or can be implemented as an electronic delay by means of a bucket brigade memory and/or on the basis of a cascade of inductances and capacitances.

One embodiment facilitates intercept-secure communication between two of the bus-user devices. It is assumed for this purpose that one of the bus-user devices is transmitting its message signal to a receiving bus-user device. While this is taking place, the receiving bus-user device transmits in full-duplex mode an interference signal, for instance pseudo-noise or a noise signal or a message sequence. Each of the at least one bus-user devices is thus configured to transmit by means of its transmit unit an interference signal during a receive mode of the associated receive circuit. Since the bus-user device uses the compensation filter to filter out again its own interference signal, the receive circuit can reconstruct the arriving message signal from the transmitting bus-user device.

One embodiment addresses the question of how a transmission of more than ten Megabits per second, in particular more than 100 Megabits per second, can be achieved by the current source circuit. In addressing this, one embodiment provides that in the corresponding bus-user device, the transmit unit thereof has a four-quadrant controller comprising an H-bridge circuit, which is configured to switch the current source circuit with alternating polarity between the lines of the line branch. In the H-bridge circuit, the current source circuit is thus connected in the transverse branch of the H-bridge circuit. The switches of the H-bridge circuit may be implemented, for example, on the basis of transistors, for instance MOSFETs (metal oxide semiconductor field effect transistors). Four-quadrant operation allows the current source circuit to inject the current into the lines of the line branch with an alternating flow direction. Since this does not require the current source circuit to be switched, but instead the four-quadrant controller takes care of reversing the direction of the current flow, and this can be done, for example, using transistors for the switching, it is possible to achieve the specified transmit rate.

In one embodiment, in the at least one bus-user device, the corresponding transmit unit is configured to inject its corresponding message signal as a differential voltage level into the lines of the line branch. In other words, transmission can thus be based, for example, on the LVDS (Low Voltage Differential Signaling) principle. This results in the advantage that using a single current source circuit in a transmit unit, it is possible to set or generate the correct voltage level for two electrical lines of the line branch.

The data network according to the invention is suitable in particular for use in a motor vehicle, where until now it was possible to provide only linear bus structures or a plurality of line branches having an active star node (for instance a switch or a hub). The invention accordingly also provides an embodiment of the data network according to the invention in a motor vehicle. In a motor vehicle, each bus-user device can be a control unit of the motor vehicle. The motor vehicle can be, for example, a passenger car or truck or motorcycle.

The operation of the data network according to the invention results in a method that is also part of the invention. The method provides that, in a data network having at least three line branches connected to one another via a passive star node, a bus-user device emits a message signal into one of the line branches to which the bus-user device is connected. The message signal propagates in the line branch, where it may be attenuated or eradicated by a termination impedance; the message signal also propagates towards the star node, where it is distributed to the other line branches. Some of the message signal is reflected at the star node, however, and is reflected in the line branch from which it has come, back to the transmitting bus-user device. In order to prevent another reflection at the transmitting bus-user devices, it is provided according to the invention that the bus-user device has a transmit unit having a current source circuit, which, in order to generate the message signal, injects an electric current into the electrical lines of the line branch, which current source circuit connects the lines to an internal impedance value that in transmit mode is constantly greater than 500 Ohms, in particular greater than one kiloohm. In other words, the bus-user device is connected to the electrical lines of the line branch at all times, and as a high impedance at all times. In particular, generating the transmit signal by short-circuiting the lines or connecting the lines to a ground potential does not take place. Hence at the bus-user device can be generated only a reflection whose reflection coefficient is smaller, the larger the internal impedance value of the current source circuit. An additional termination circuit can be used to match the reflection in the described manner, and therefore the transmit unit overall has an adjustable connecting impedance between the lines of the line branch. This connecting impedance can equal the characteristic impedance of the line branch if the bus-user device is connected to the line end of the line branch, or can have as large an internal impedance value as possible, where "as possible" is constrained by the internal impedance of the current source circuit.

The invention also includes embodiments of the method according to the invention having features that have already been described in connection with the embodiments of the data network according to the invention. For this reason, the corresponding embodiments of the method according to the invention are not described here again.

The invention also includes developments of the method according to the invention having features which have already been described in connection with the developments of the data network according to the invention for a motor vehicle. For this reason, the corresponding developments of the method according to the invention are not described here again.

The invention also comprises the combinations of the features of the described embodiments.

Exemplary embodiments of the invention are described below, in which regard:

FIG. 6 illustrates a transmit mode of a bus-user device at a line end of the data network of FIG. 2.

The exemplary embodiment explained below is a preferred embodiment of the invention. In the exemplary embodiment, the described components of the embodiment each represent individual features of the invention that should be considered independently of one another and that each also develop the invention independently of one another and can therefore also be considered to be part of the invention individually or in a combination other than that shown. Furthermore, the embodiment described can also be supplemented by further features of the invention that have already been described.

In the figures, elements with the same function are each provided with the same reference signs.

Figure 1:
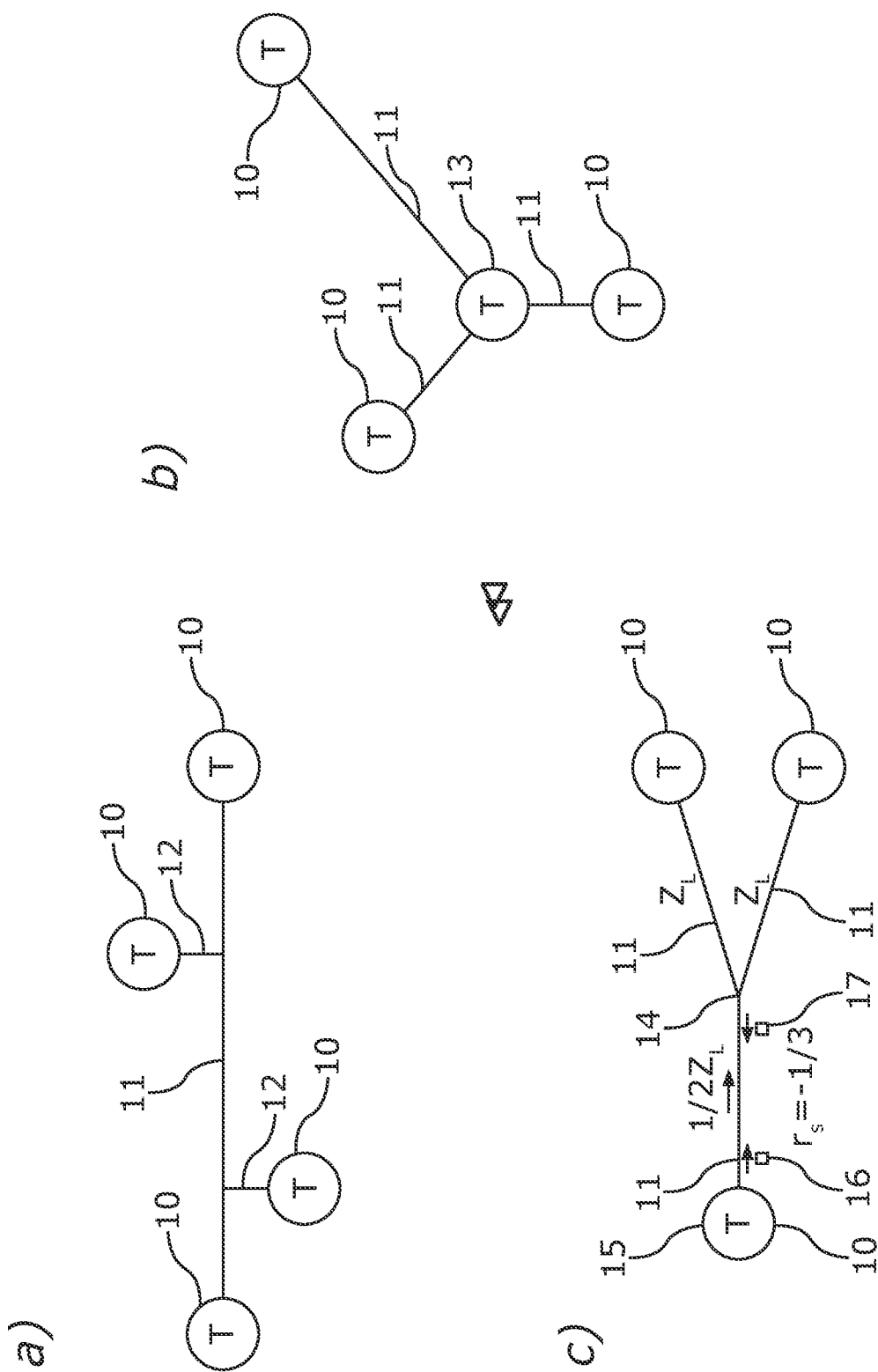
FIG. 1 shows a comparison of network topologies from the prior art with a possible topology of a data network according to the invention.

FIG. 1 shows two network topologies a, b, as might be provided in the prior art. It also illustrates as an additional network topology c an embodiment of the data network according to the invention. The figure shows how bus-user devices 10 may be connected to one another via line branches 11. In the topology a is provided a linear bus structure, to which the bus-user devices 10 can be connected on a long line branch, and short stubs 12 are permitted only as an exception because otherwise there may be unwanted reflections of message signals. This is a typical network in a linear structure (bus structure) with termination of a line at the endpoints T and without termination for network nodes that are connected to the shared-use line by relatively short "stubs". Many of today's networks in the automobile, for instance the CAN bus or Flexray bus, are implemented in this topology. The (linear) bus structure shown in FIG. 1 (a), for instance in the CAN bus, is not very convenient for implementation in a motor vehicle; a star structure would often be better suited.

The network topology b allows a plurality of line branches 11, but these have to be interconnected via an active switch 13 in order to avoid reflections. Topology b is a star structure having a central, active network node and point-to-point connected network nodes.

The network topology c allows line branches 11 to be connected to one another via a passive star node 14. Proceeding on the assumption that a bus-user device 15 is a transmitting bus-user device that is emitting a message signal 16 into the data network, then from the viewpoint of the transmitting bus-user device 15, the arrangement comprising the three line branches 11 shown can be interpreted in the manner that on the other side of the star node 14, each line branch 11 can have a line impedance $Z_L$, and hence this can result in a line impedance of 0.5 $Z_L$ from the viewpoint of the transmitting bus-user device 15. The message signal 16 is reflected at the star node 14 with a reflection coefficient $r_s=-\frac{1}{3}$, resulting in a reflected part 17 of the message signal, which can arrive again at the transmitting bus-user device 15.

Figure 2:
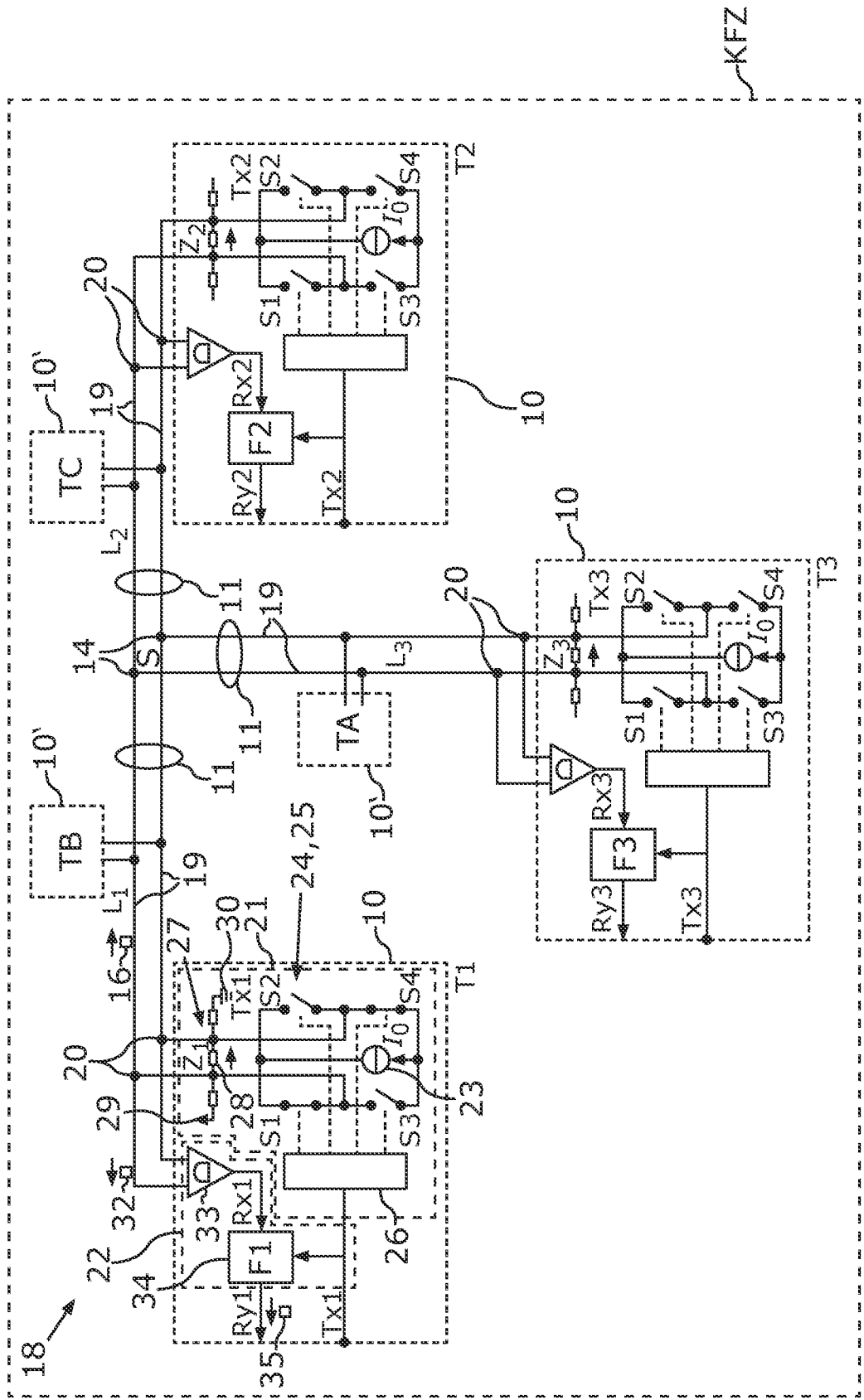
FIG. 2 is a schematic diagram of an embodiment of the motor vehicle according to the invention having an embodiment of the data network according to the invention.

FIG. 2, with regard to the network topology c, illustrates a data network 18, in which are interconnected via the star node 14 three line branches 11, with the individual electrical lines 19 of each being shown in FIG. 2. The line branches 11 are distinguished here by notations L1, L2, L3; the star node 14 is also labeled as star node S. The bus-user devices 10 connected to respective line ends 20 are also labeled as bus-user devices T1, T2, T3. Bus-user devices 10', which are connected between the corresponding line end 20 and the star node 14 of the corresponding line branch 11, are labeled here by way of example as bus-user devices TA, TB, TC.

The data network 18 can be provided in a motor vehicle KFZ, in which case the bus-user devices 10, 10' may be control units, for example. A transmit unit 21 and a receive circuit 22 are shown for each of the bus-user devices 10. For the sake of clarity, only the bus-user device T1 is described below; the other bus-user devices 10, 10' can have the same design, although a difference between the bus-user devices 10 and the bus-user devices 10' will be described in greater detail in connection with FIG. 6 and FIG. 7.

In the transmit unit 21, a current source circuit 23 can be connected to the lines 19 of the line branch 11 via a four-quadrant controller 24 comprising an H-bridge circuit 25. The current source circuit 23 can inject an electric current I0 into the lines 19 in order to emit a message signal 16. For this purpose, a control circuit 26 can switch switches S1, S2, S3, S4 of the bridge circuit 25 according to a temporal waveform of the transmitted message signal 16, such as can be defined as the transmit signal TX1 by a microcontroller of the bus-user device 10, for example. Since the bus-user device 10 is connected at the line end 20 of the line branch 11, a termination circuit 27 can additionally be provided, by means of which the lines 19 can be electrically connected or terminated by a termination impedance 28 of impedance value Z1, where the impedance value Z1 can equal the line impedance of the line branch 11. It can also be provided to set voltage levels on the lines 19 by means of a voltage source 29 and a ground potential 30 for the time interval outside the transmit mode of the bus-user device 10. This is known per se from the prior art and is therefore not explained in further detail.

The receive circuit 22 can be used to receive by means of a difference amplifier 33 (D) a receive signal 32 as a voltage signal that appears between the lines 19, so that the receive signal 32 can be provided as the signal RX. A compensation filter 34 (F1 for the bus-user device T1) can be used to subtract at a time offset the message signal 16 currently being emitted by the bus-user device, in which process weighting or scaling is also possible. This results in a compensated receive signal 35, which is also labeled here as Ry. The numbering of the signals corresponds to the numbering of the individual bus-user devices T1, T2, T3.

Figure 3:
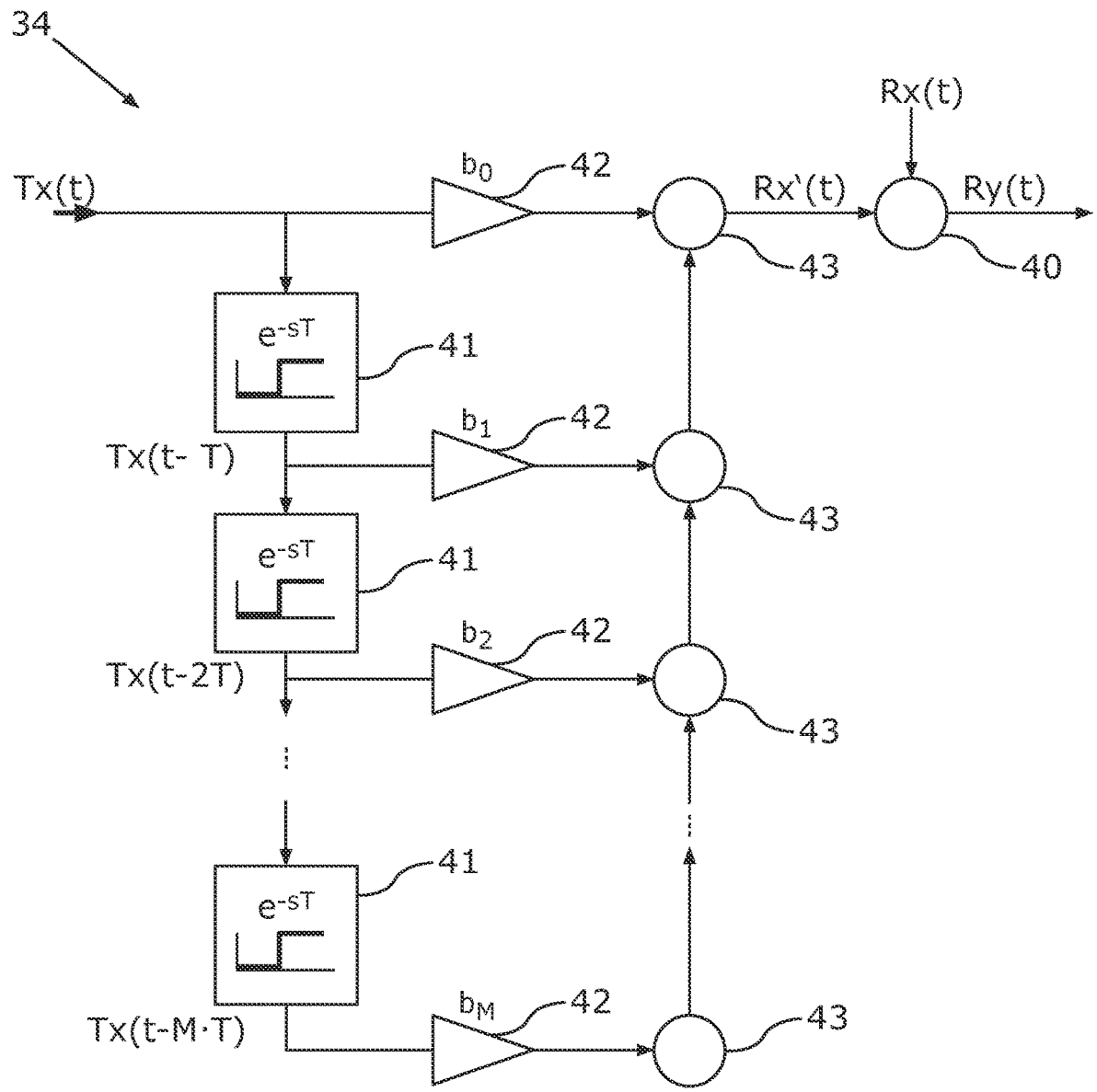
FIG. 3 is a schematic diagram of a compensation filter such as can be provided in a bus-user device of the data network of FIG. 2.

FIG. 3 illustrates an embodiment of a compensation filter 34 by way of example. It is assumed in the diagram in FIG. 3 that a single symbol to be transmitted (for instance one bit) has a symbol time length T. The figure shows how the message signal Tx to be transmitted is fed into the compensation filter 34, and shows an estimated echo signal Rx'(t), which can be superimposed on the receive signal Rx(t) by means of a superposition circuit 40, resulting in the compensated receive signal Ry(t).

In order to determine the estimated echo signal Rx'(t), a cascade of delay elements 41 can be provided, each of which can generate a time delay of length equal to the symbol time length T. By feeding the transmit signal Tx(t) into the cascade of the delay elements 41, delayed variants Tx(t−T), Tx(t−2T) . . . of the transmit signal Tx(t) can be generated, each of which can be scaled or weighted by an amplifier circuit 42 in order to obtain an attenuated variant or an attenuated version of the respectively delayed transmit signal. A total of M delay elements 41 are provided. The gain is represented here as $b_0$ to $b_M$ respectively. Additional superposition circuits 43 can perform summation, resulting in the estimated echo signal Rx(t). The delay elements 41 and/or the amplifier circuits 42 and/or the superposition circuits 40, 43 can each be implemented as an analog circuit. For example, the superposition circuits 42, 40 can be implemented as analog adder circuits or generally on the basis of at least one operational amplifier and/or transistor, the amplifier circuits 42 on the basis of an operational amplifier, and the delay elements 41 on the basis of a delay line.

Figure 4:
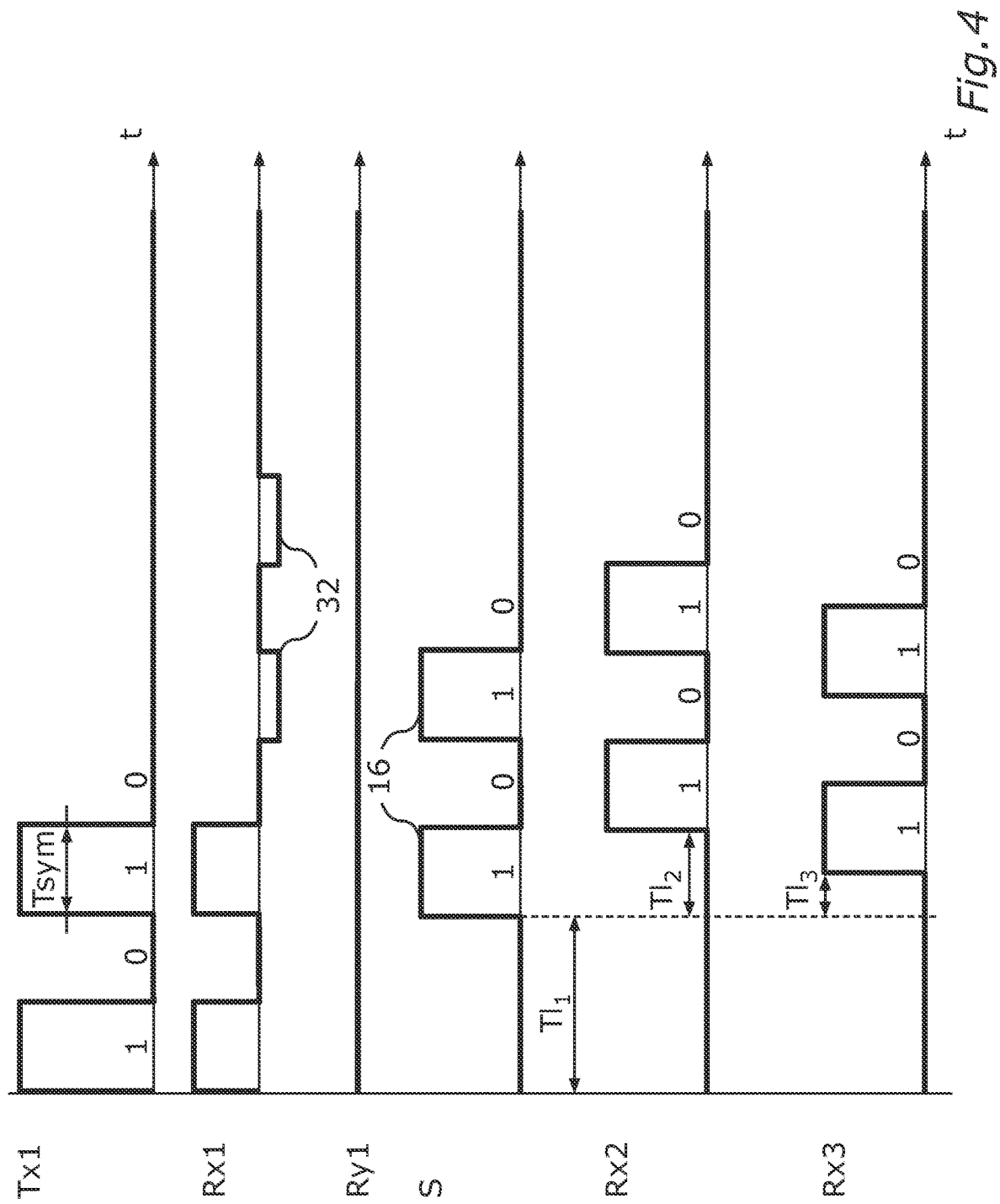
FIG. 4 is a graph of temporal waveforms of signals such as can arise in the data network of FIG. 2.

FIG. 4 illustrates operation of the data network 18. It shows over time t how a transmit signal tx1 of the bus-user device t1 can be defined, which can be fed by the transmit unit 21 of the bus-user device T1 into the line branch L1. A symbol time length is labeled here by Tsym, which equals the symbol time length Ty3.

The receive circuit 22 of the bus-user device T1 receives the message signal directly as Rx1, and also the echo in the receive signal 32 after a length of time equal to the travel time of the message signal from the bus-user device T1 to the star node 14 and back to the bus-user device T1. The compensated receive signal Ry1 no longer comprises any reflections because the compensation filter 34 has estimated the echo signal correctly and removed it from the receive signal Rx1.

Also shown is the message signal 16 incident at the star node S, which arrives at the star node S with a time offset $tl_1$, which equals the travel time from the bus-user device T1 to the star node S.

At the star node S, the message signal 16 is split and transferred into the two line branches $L_2$ and $L_3$ (see FIG. 2). The travel time from the star node S to the respective bus-user device T2, T3 results in a respective additional travel time $T1_2$ and $T1_3$, and as the temporal waveform shows, the star node S does not cause a reflection in the line branches $L_2$, $L_3$.

Figure 5:
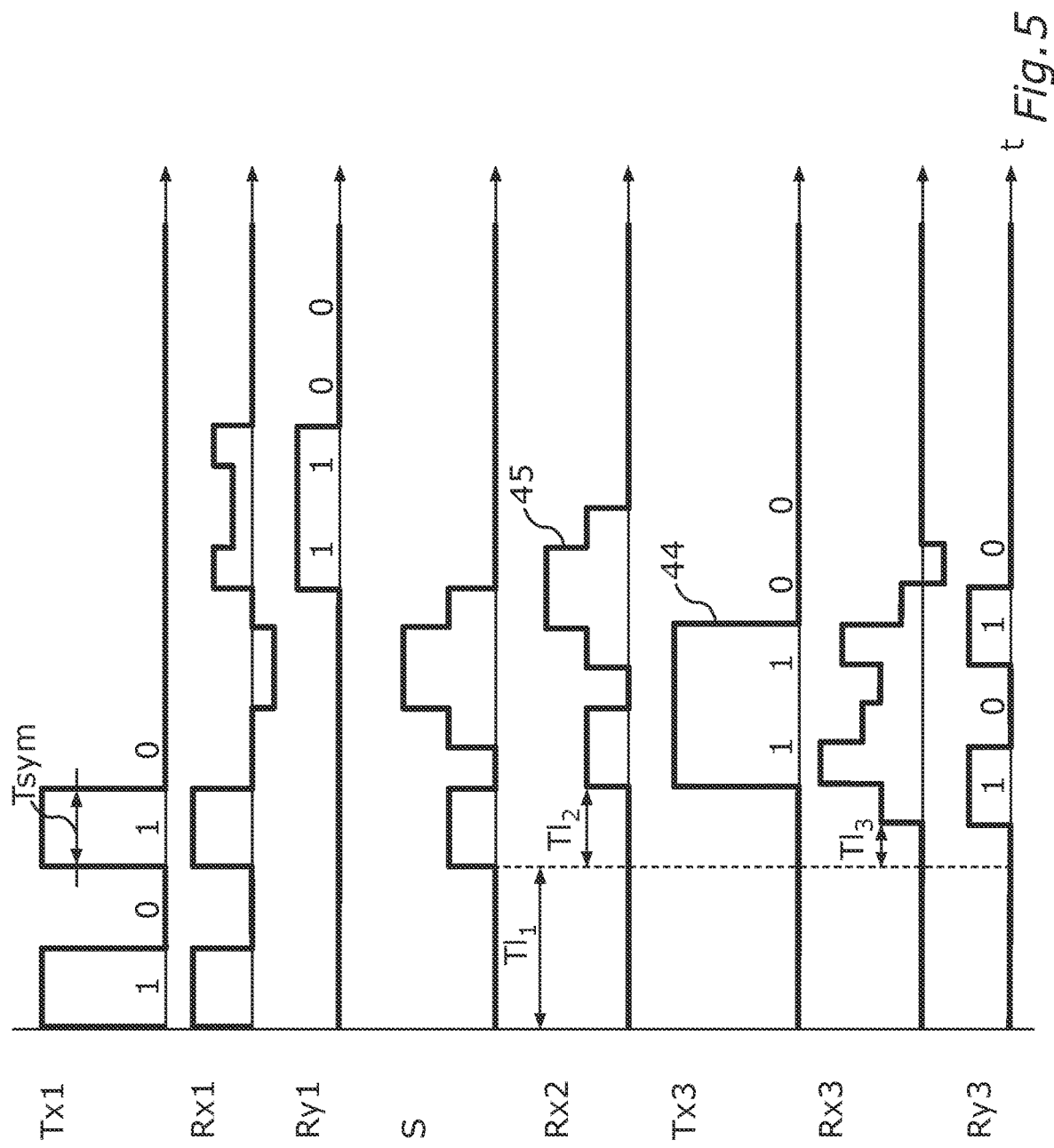
FIG. 5 is a graph of temporal waveforms of signals such as can arise in the data network of FIG. 2 in full-duplex operation.

FIG. 5 illustrates in a graph over time t the same transmit situation with regard to the bus-user device T1. In addition, FIG. 5 is based on an example in which the bus-user device T3 is also generating a message signal Tx3, which is distributed via the star node S into the other two line branches $L_1$ and $L_2$. The signal emitted by the bus-user device T3 can be an interference signal 44 which interferes with the receive signal Rx2 of the bus-user device T2 in the manner that the message signals Tx1 and Tx3 are superimposed and therefore a distorted receive signal 45 is received in the bus-user device T2 that can no longer be interpreted or understood in the bus-user device T2. In contrast, the compensated receive signal Ry1 in the bus-user device T1 shows that the bus-user device T1 can receive the message signal Tx3 from the bus-user device T3 correctly, while the bus-user device T3 can use its compensation filter to generate a compensated receive signal Ry3 that corresponds to the temporal waveform of the message signal Tx1 from the bus-user device T1. Hence the bus-user devices T1 and T3 can communicate with each other without errors, i.e. can reconstruct their respective message signal, whereas the bus-user device T2 can receive only a distorted receive signal 45.

FIG. 6 shows an equivalent diagram view of operation of a bus-user circuit 10 at a line end. It shows three operating phases B1, B2, B3, where the operating phase B1 can represent a receive mode, and the operating phases B2 and B3 a transmit mode. The operating phases B2 and B3 differ in that different symbols are being transmitted, which can be achieved by the switching representations of the switches S1 to S4. FIG. 6 also shows, in the form of the equivalent circuit 50, how each bus-user device 10 appears electrically to the line branch 11 at the line end 20. As a result of the internal impedance of the current source circuit 23, only the termination impedance Z is effective, which is why the same impedance value Z is effective at the line end 20 regardless of the operating phase B1, B2, B3. The comparison of the operating phases B2, B3 shows how, by means of the switch positions of the switches S1 to S4 of the bridge circuit 25, the electric current $I_0$ generated by the current source circuit 23 is fed into the lines 19 of the line branch 11 at the line end 20 with a different polarity or flow direction.

Figure 7:
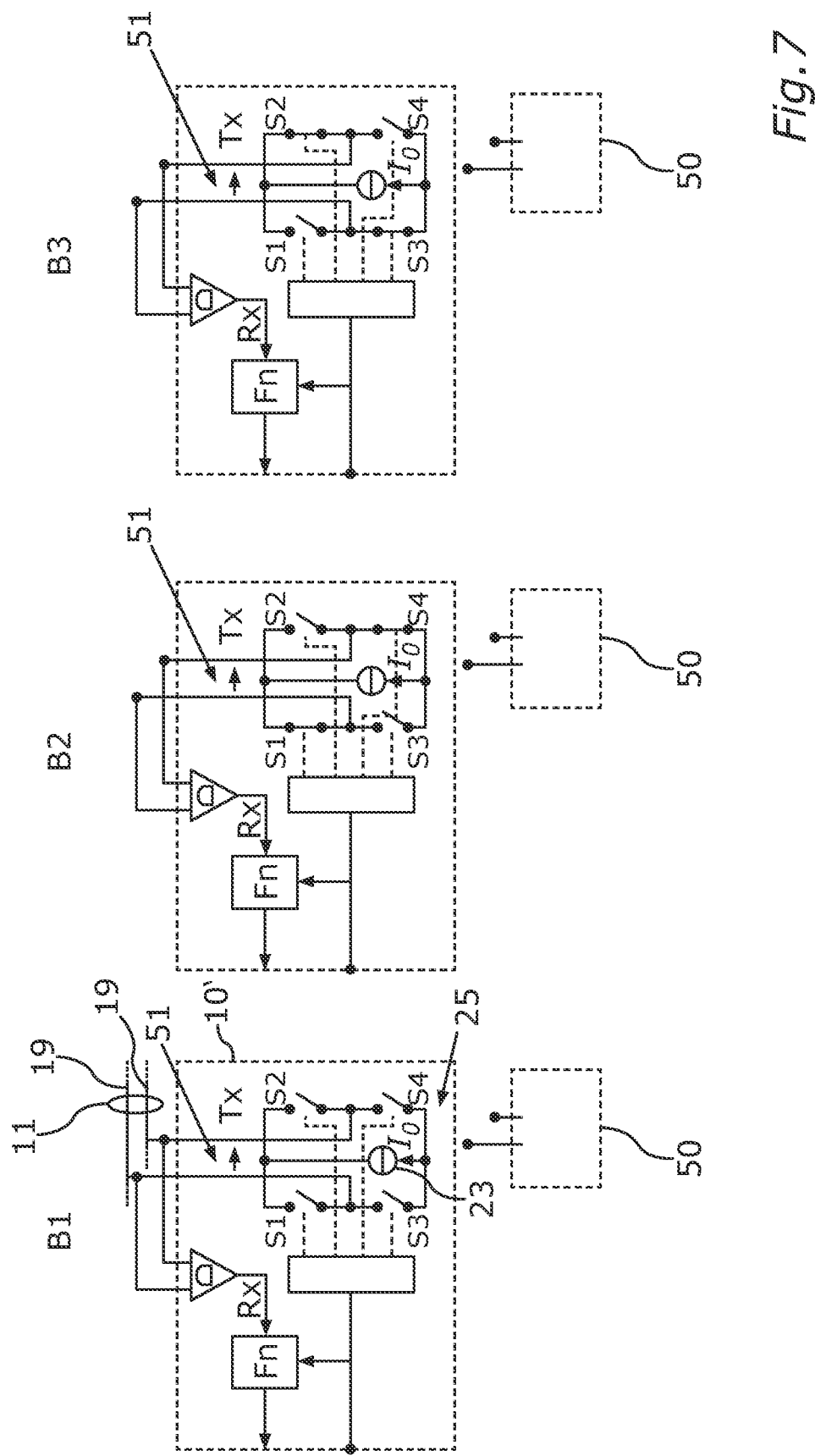
FIG. 7 is a schematic diagram for illustrating a transmit mode of a bus-user device connected between a line end and a star node in the data network of FIG. 2.

FIG. 7 illustrates in a similar manner to FIG. 6, as an equivalent circuit 50, the electrical effect of a bus-user device 10', which is not connected at the line end 20 but between the line end 20 and the star node 14 (see FIG. 2). In the diagram of FIG. 2, it may be one of the bus-user devices TA, TB, TC.

Since the termination circuit 27 is not present and instead an open-circuit 51 is provided, only the electrical impedance of the current source circuit 23 and of the H-bridge circuit 25 are effective, which, because of the internal impedance values in the equivalent circuit 50, appears to the lines 19 of the line branch 11 as an open-circuit, which prevents reflections.

Known bus systems in the motor vehicle mostly use the described linear structure of an electrical two-wire line having a termination at both ends, in order that the propagating waves can be used for signal transmission with minimum possible reflection (see FIG. 1 (a)). Short stubs having a short, high-impedance coupling are allowed, and this is used extensively, for instance in CAN, CAN-FD or FlexRay or in the first Ethernet standards 10-Base5 and 10-Base2.

The aim when creating a network in the vehicle is often a star structure, but the stipulation of short stubs means this is not easy to achieve. Especially at high bit rates, the reflecting signal components are often of such severity that it is hard to ensure interference-free operation (CAN, CAN-FD).

The object is generally to operate a star structure having simply and inexpensively coupled line segments for high-speed communication in the motor vehicle. The object is also to increase the security of systems in the vehicle and to tighten against attacks by hackers.

The communication in the vehicle can also be protected from malicious attacks in that it is possible to employ, according to the invention, full-duplex transmission with pseudo-random signals. The present idea of secure full-duplex transmission can also be used in a high-speed star network. Half-duplex operation is also possible, however.

The bus system uses for the signal transmission a line having termination impedances matched to the line characteristic impedance ($Z_L$) in order to prevent reflections (e.g. CAN, CAN-FD, Flexray) as shown in FIG. 1 (c).

The present idea describes a possible way of operating at high symbol rates a passive star structure by way of example shown in FIG. 1 (c) and implemented according to the idea. In this case, the idea of exactly one central point with reflection is used. This is obtained when, for instance, two line segments terminated with characteristic impedance $Z_L$ are connected in parallel. The connected, for instance third, line segment is thus terminated with $Z_L/2$, the reflection coefficient at the star node $r_s=-\frac{1}{3}$ is the same for all the segments, but the resultant reflection is easy to manage, as this invention shows. At the same time, full-duplex transmission between two bus users is facilitated, which can also be used for intercept-secure message exchange. The application 10 2018 216 949.7 outlines such a possibility for short point-to-point connections, and assumes that at each end are transceivers that are matched in a defined manner. Such matching can be achieved, for instance, by LVDS transceivers in accordance with IEC 644.

Thus preferably a passive star network having relatively long line segments is sought as the desired topology. The endpoints are transceivers which at each of the endpoints ensure excellent termination of the line by its characteristic impedance. This termination is equally good in every operating state, in particular also during transmitting. The use of such type 1 transceivers, which always have a matched termination, at the end nodes of the star is an advantageous feature of the idea described here and is in contrast with the low-impedance transceivers having a passive star node.

FIG. 2 shows the basic diagram of a star network for the 3 (or generally N) transceiver end nodes (T1, T2 and T3), which are connected to the shared bus via the lines $L_1$, $L_2$ and $L_3$ (type 1). The lines are galvanically connected via a star node S. The lines are not necessarily short, and therefore reflections form when a wave emanating from a transmitter (here e.g. transceiver T1) travels up to the star node as a forward traveling wave. The invention exploits the fact that the reflection at the star node is embodied as a wave traveling backwards towards the transmitter 1. The other stations (e.g. transceivers T2, T3), however, receive only the forward traveling wave without reflection. If the transmitting transceivers are equipped with filters F1, F2, F3 . . . according to the invention, it is also possible for a second transceiver to transmit simultaneously (full-duplex operation).

High-impedance transceivers of type A for coupling via short stubs are also possible (TA, TB, TC); see FIG. 2 and FIG. 7. Type 1 transceivers hence always have a matched termination; type A transceivers are always high impedance so are not terminated.

The abbreviations used for the following description of a preferred exemplary embodiment are defined again in summary:

Txn transmitter voltage
Rxn receiver differential voltage
Ryn receiver voltage filtered according to the invention
$Z_n$ termination impedance
$Z_n=Z_L$ (type 1 transceiver) or $Z_n=\infty$ (type A transceiver)
D high-impedance difference amplifier
Fn reflection-compensation filter according to the invention
Ln line segments of characteristic impedance $Z_L$ and length invention
$I_0$ constant current for signal encoding, e.g.: $I_0$=10–20 mA
S passive star node Half-duplex mode is described below by way of example:

The following parameters are used to consider the arrangement shown in FIG. 2: NRZ symbol time length $T_{sym}$=10 ns, hence symbol rate $f_{sym}$=100 MBaud, line lengths $l_1$=4 m, $l_2$=2 m, $l_3$=1 m; a typical phase velocity on twisted two-wire lines of ⅔ the speed of light $v_{PH}$=2·10$^8$ m/s yields a signal travel time of $T_1$=1/$v_{PH}$=5 ns/m. The signal travel times along the line segments hence equal $T_{11}$=20 ns, $T_{12}$=10 ns, $T_{13}$=5 ns. The reflection coefficient $r_s$ at the star node S equals for N=3 end nodes:

| with N = 3 end nodes | $r_S = \dfrac{\dfrac{Z_L}{2} - Z_L}{\dfrac{Z_L}{2} + Z_L} = -\dfrac{1}{3}$ (1) |
|---|---|
| Generally with N end nodes | $r_S = \dfrac{\dfrac{Z_L}{N-1} - Z_L}{\dfrac{Z_L}{N-1} + Z_L} = \dfrac{1-N+1}{1+N-1} = -\dfrac{N-2}{N}$ |

The present idea is based on the finding that in a star network having a passive star S, i.e. a simple interconnection of long line segments without any additional circuitry, a well-defined reflection occurs, but which only propagates towards the transmitter. The present idea is based on transceivers that always have a correct termination, in particular during the transmit process, which is in contrast to many conventional networks.

In the preferred arrangement according to FIG. 1 (c) and FIG. 2, the reflection at the star node has an effect just simply at the transmitter, whereas the reflection does not reach the other receivers, leading directly to the usage in half-duplex mode. After transceiver T1 transmits a message, it is simply necessary to wait twice the signal travel time 2·T·$L_{L1}$ after the end of the message (here e.g. transmit sequence 1010) plus the time length of the message (here 4·$T_{sym}$) until the reflection at transceiver T1 has disappeared.

A filter apparatus F1, F2, F3 . . . can be connected after each receiver difference amplifier D in order to compensate the reflections expected in transmit mode. A cascade of delay elements of uniform delay time T and having a number of weighting factors b is suitable as the filter structure, similar to a non-recursive FIR filter, in order to compensate at the output Ry the expected transmitter-based reflection at the input Rx:

FIG. 1 shows a possible implementation of the receive filters according to the invention in each of the transceiver end nodes (T1, T2, T3, . . . ) and TA, TB, TC, . . . which are connected after the output signals Rx from the difference amplifiers D of the receivers. Similar to a digital non-recursive FIR filter, a cascade of M delay elements of delay time T having a number of weighting elements $b_0, b_1, \ldots b_M$ is used, the outputs of which are summed in order to compensate the expected reflection behavior at the outputs Ry.

The expected receive signal can be determined theoretically for a star network as shown in FIG. 2:

| For T1, expected receive signal: | $R\tilde{x}_1(t) = Tx_1(t) + r_S \cdot Tx_1(t - 2T_{11})$ (2) |
|---|---|
| For m < M | $m = \dfrac{2T_{11}}{T}$ |
| Filter coefficients: | $b_0 = 1$<br>$b_m = r_S$ |
| Filter output: | $Ry_1(t) = Rx_1(t) - R\tilde{x}_1(t) = Rx_1(t) - b_0 \cdot Tx_1(t) - b_m \cdot Tx_1(t - mT)$ (3) |

With the parameters used for the diagram in FIG. 4: Symbol time length $T_{sym}$=10 ns (accordingly $f_{sym}$=100 MBaud, signal travel times $T_{11}$=20 ns, $T_{12}$=10 ns, $T_{13}$=5 ns, reflection coefficient at the star node: $r_s$=−0.333 for N=3 end nodes, the reflection signal that arises can be suppressed at the associated receiver by a filter F (see FIG. 1 with filter F1 for transceiver 1). Assuming that a filter having M=10 travel-time elements each with T=5 ns is available, according to (2), optimum compensation is obtained for m=40 ns/5 ns=8, $b_0$=0.5, $b_8$=−0.333, see Ry1 in FIG. 4.

The optimum setting for the filters can be fixed for each station or else made adaptively, for instance if a known bit sequence is provided in the protocol used, similar to the synchronization byte for Ethernet.

In principle, topologies having a plurality of passive star nodes are possible, although this complicates the filter structures for compensating a plurality of reflections.

This can be contrasted with the negative impact of a passive star having conventional, transmitter-based low-impedance transceivers (as per CAN, Flexray): Here, the reflections occur at the receivers, where they can no longer be compensated. Thus for good reason, star structures containing long line segments are not permitted in the majority of conventional networks, but only a linear structure (bus structure) having two line ends with the best possible termination.

Full-duplex mode is described below by way of example:

The arrangement shown in FIG. 2 having the filter apparatuses F1, F2, F3, . . . according to the invention can also be used advantageously for full-duplex communication between 2 bus users, because the transmitting station is the sole node in the network at which any reflection arrives, and can compensate this reflection according to the invention by means of filters. Therefore a protocol can be specified that allows a second station to transmit as well while a first station is transmitting.

FIG. 5 shows such a full-duplex situation: a station 1 transmits via transceiver T1 the bit sequence 1010, which is suppressed by the filter apparatus F1 (Ry1).

According to the method, immediately after receiving the first part of the message from station 1 (signal Ry3), station 3 starts to transmit the bit sequence 1100 via transceiver T3. As a consequence, a wave propagates from transceiver 3 towards the star node, and is partially reflected there (reflection coefficient $r_s$) and again forms a wave traveling backwards towards station 3, where it can be compensated by compensation filter F3. Hence station 3 can receive the signal 1010 from station 1 without interference.

At the star node S and at the receiver 2 (Rx2), however, the superposition of the transmit signal Tx1 and the transmit signal Tx3 means that decoding into the underlying bit sequence is not possible.

Although reflections can also be observed immediately after the receiver 1 (Rx1), these are compensated by the filter F1 according to the invention, and therefore the bit sequence 1100 transmitted by station 3 is detected at the output Ry1. The same applies to station 3; because this station is transmitting, the compensation filter F3 can compensate the reflections and the associated transmit signal, with the result that the bit sequence 1010 transmitted by station 1 can be detected without error.

Thus the arrangement according to the invention shown in FIG. 2 allows full-duplex communication with messages between any 2 stations, which is particularly advantageous for handshake protocols similar to TCP/IP.

With the arrangement shown in FIG. 2, full-duplex communication can also be used for communication obfuscation: while a station is transmitting a security-relevant message, this can be superimposed with a second pseudo-random signal by a receiving station, for instance during a key exchange.

The present idea basically describes a network at the physical layer (OSI layer 1), with other networks able to undertake the aspects of the data link layer (OSI layer 2) such as arbitration, error detection and error correction etc., so for instance it is conceivable that UART communication similar to RS-485 or Ethernet Frames as per IEEE 802.3 are used with the present network.

Advantageous aspects of the idea are summarized in the following list:

1. A method and an arrangement as shown in FIG. 2, characterized in that stations in a star network having relatively long line segments with transceivers which always have a matched termination are operated such that a reflection takes place only at the star node and propagates towards the transmitting transceiver and not up to the other receiving transceivers.
2. A method and an arrangement as shown in FIG. 2, characterized in that a filter is connected after the high-impedance difference amplifiers in the receiver part of the transceiver, which filter is suitable for compensating in the receiver part of the transmitting transceiver the reflection caused by the transmitter part of the transceiver.
3. A method and an arrangement according to aspect 1 or aspect 2, characterized in that each station transmits in half-duplex operation, and a protocol provides that a sufficient time interval to the next message must be observed in order to avoid interference with reflections.
4. A method and an arrangement according to aspect 2, wherein each station transmits in half-duplex operation, and a protocol provides that after specified, preferably short, times, another transmit process can take place without having to wait for reflections.
5. A method and an arrangement according to aspect 2, wherein each station in full-duplex operation transmits as a second station while a first transmit process is already taking place without having to wait for reflections, wherein both stations mutually exchange information.
6. A method and an arrangement according to aspect 2 and aspect 5, wherein each station transmits as a second station while a first transmit process is already taking place without having to wait for reflections, wherein one station communicates information to the second station, the second station, by transmitting a random signal, makes decoding the signal on the line segments practically impossible, although the second station is able to suppress this random signal effectively by means of the filter apparatus according to the invention.
7. A method according to aspect 1 or 2, wherein a plurality of passive star nodes are present, connected by long line segments. The sub-aspects 3 to 6 apply thereto accordingly.

Overall, the example shows how the invention can provide a high-speed and intercept-secure data network.

LIST OF REFERENCE SIGNS 10 bus-user device
11 line branch
12 stub
13 switch
14 star node
15 bus-user device
16 message signal
17 part
18 data network
19 lines
20 line end
21 transmit unit
22 receive circuit
23 current source circuit
24 four-quadrant controller
25 bridge circuit
26 control circuit
27 termination circuit
28 termination circuit
29 voltage source
30 ground potential
32 receive signal
33 difference amplifier
34 compensation filter
35 receive signal
40 superposition circuit
41 delay elements
42 amplifier circuit
43 superposition circuit
44 interference signal
55 receive signal
50 equivalent circuit
51 open-circuit
B1 operating phase
B2 operating phase
B3 operating phase
$I_0$ electric current
T1, T2, T3 bus-user device
Z internal impedance value

The invention claimed is:

1. A data network having at least three line branches connected to one another via a common star node in order to distribute message signals from one of the line branches onto other line branches, wherein connected to at least one of the line branches is at least one bus-user device each configured to generate in a corresponding transmit mode by a corresponding transmit unit at least one of the message signals, wherein the corresponding bus-user device, the transmit unit thereof has a current source circuit which, in generating the message signal (16), is configured to inject an electric current into electrical lines of the line branch to which the bus-user device is connected, wherein via the current source circuit the lines are connected to an internal impedance value that in transmit mode is constantly greater than 10 times the value of characteristic impedance of the line branch.

2. The data network as claimed in claim 1, wherein in at least one bus-user device which is connected to a line end of one of the line branches, its transmit unit has a termination circuit connected in parallel with the current source circuit, and the termination circuit connects the electrical lines at the line branch to which the bus-user device is connected, and has an impedance value equal to a characteristic impedance of the line branch.

3. The data network as claimed in claim 1, wherein in at least one bus-user device which is connected between a line end of one of the line branches and the star node, this bus-user device has an open-circuit, which, at least in an event that the current source circuit is inactive, or else continuously, electrically isolates the lines of the line branch.

4. The data network as claimed in claim 1, wherein each of the at least one bus-user devices has a receive circuit, which is configured to receive as a receive signal from the corresponding line branch to which the bus-user device is connected at least one message signal from another bus-user device, wherein the receiver circuit comprises a compensation filter, which is configured such that when the transmit unit of an associated bus-user device is in transmit mode, it superimposes with a time offset an associated message signal emitted by the transmit unit negatively on the receive signal and in a weighted manner, wherein a time offset of the negative superposition equals a signal travel time from the bus-user device to the star node and back to the bus-user device, which signal travel time arises in the line branch.

5. The data network as claimed in claim 4, wherein the compensation filter is implemented based on at least one analog delay line and at least one amplifier circuit.

6. The data network as claimed in claim 5, wherein each of the at least one bus-user devices is configured to emit by the transmit unit an interference signal during a receive mode of an associated receive circuit.

7. The data network as claimed in claim 4, wherein each of the at least one bus-user devices is configured to emit by the transmit unit an interference signal during a receive mode of an associated receive circuit.

8. The data network as claimed in claim 1, wherein in the corresponding bus-user device, the transmit unit thereof has a four-quadrant controller comprising an H-bridge circuit, which is configured to switch the current source circuit with alternating polarity between the lines of the line branch.

9. The data network as claimed in claim 1, wherein in the at least one bus-user device, the corresponding transmit unit is configured to inject its corresponding message signal as a differential voltage level into the lines of the line branch.

10. A motor vehicle having a data network as claimed in claim 1.

11. The data network as claimed in claim 1, wherein the internal impedance value of the current source circuit in transmit mode is constantly greater than 500 Ohms.

12. A method for operating a data network having at least three line branches connected to one another via a common star node in order to distribute message signals from one of the line branches onto other line branches, wherein connected to at least one of the line branches is at least one bus-user device in each case, which is configured to generate in a corresponding transmit mode by means of a corresponding transmit unit at least one of the message signals, characterized in that in the corresponding bus-user device, the transmit unit thereof has a current source circuit which, in generating the corresponding message signal, injects an electric current into electrical lines of the line branch to which the bus-user device is connected, wherein via the current source circuit the lines are connected to an internal impedance value of the current source circuit that in transmit mode is constantly greater than 10 times the value of characteristic impedance of the line branch.

13. The method for operating a data network as claimed in claim 12, wherein the internal impedance value of the current source circuit in transmit mode is constantly greater than 500 Ohms.

* * * * *